US007639065B2

(12) United States Patent
Miyazaki

(10) Patent No.: US 7,639,065 B2
(45) Date of Patent: Dec. 29, 2009

(54) SEMICONDUCTOR INTEGRATED CIRCUIT INCLUDING CIRCUIT BLOCKS AND VOLTAGE CONTROLLER

(75) Inventor: Takayuki Miyazaki, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/743,433

(22) Filed: May 2, 2007

(65) Prior Publication Data

US 2008/0036434 A1 Feb. 14, 2008

(30) Foreign Application Priority Data

Aug. 9, 2006 (JP) ............................. 2006-217352

(51) Int. Cl.
*G11C 5/14* (2006.01)

(52) U.S. Cl. ....................... 327/530; 327/333; 327/538; 327/540; 326/80; 326/81

(58) Field of Classification Search ................. 327/530, 327/538, 540, 333; 326/80–81
See application file for complete search history.

(56) References Cited

U.S. PATENT DOCUMENTS

| | | | | |
|---|---|---|---|---|
| 5,990,729 | A * | 11/1999 | Kozuka et al. | 327/543 |
| 6,157,070 | A | 12/2000 | Lin et al. | |
| 6,456,147 | B1 * | 9/2002 | Kohamada | 327/407 |
| 6,724,223 | B2 * | 4/2004 | Ichiguchi et al. | 326/81 |
| 2003/0193349 | A1 * | 10/2003 | Shimizu et al. | 326/81 |

FOREIGN PATENT DOCUMENTS

| | | |
|---|---|---|
| JP | 2004-165993 | 6/2004 |
| JP | 2005-236848 | 9/2005 |

* cited by examiner

*Primary Examiner*—Lincoln Donovan
*Assistant Examiner*—John W Poos
(74) *Attorney, Agent, or Firm*—Oblon, Spivak, McClelland, Maier & Neustadt, L.L.P.

(57) ABSTRACT

A semiconductor integrated circuit includes a first circuit block which operates at a first internal voltage, a second circuit block which operates at a second internal voltage, is connected to an output stage of the first circuit block, and receives a signal from the first circuit block, and a voltage controller which supplies the first internal voltage to the first circuit block by using a first high-potential power, supplies the second internal voltage to the second circuit block by using a second high-potential power, and performs control such that the second internal voltage does not exceed the first internal voltage.

14 Claims, 8 Drawing Sheets

SEMICONDUCTOR INTEGRATED CIRCUIT INCLUDING CIRCUIT BLOCKS AND VOLTAGE CONTROLLER

CROSS-REFERENCE TO RELATED APPLICATIONS

This application is based upon and claims the benefit of priority from prior Japanese Patent Application No. 2006-217352, filed Aug. 9, 2006, the entire contents of which are incorporated herein by reference.

BACKGROUND OF THE INVENTION

1. Field of the Invention

The present invention relates to a semiconductor integrated circuit and, more particularly, to a semiconductor integrated circuit having a plurality of power domains.

2. Description of the Related Art

The operating power supply voltage of a semiconductor integrated circuit such as a system large-scale integrated circuit (LSI) tends to lower owing to downsizing of elements such as transistors caused by micropatterning in the semiconductor process.

Also, to reduce the power consumption of a semiconductor integrated circuit, a plurality of circuit blocks forming the semiconductor integrated circuit are operated by different power supply voltages in accordance with the functions of the circuit blocks. A clustered voltage scaling (CVS) method and voltage-island method are known as methods of forming a plurality of circuit blocks in accordance with different power supply voltages.

To prevent a crowbar current between circuit blocks, however, these methods impose limitations on the connections of the circuit blocks or require latch circuits, flip-flops, level converters, or the like as interface circuits for signals flowing between the circuit blocks. Also, the latch circuits, flip-flops, level converters, or the like inserted between the circuit blocks must be designed so as not to generate any crowbar current at an assumed power supply voltage. A design like this imposes limitations on the configuration of the circuit blocks.

In addition, the overhead of the interface circuits inserted between the circuit blocks makes it difficult to divide the circuit blocks by decreasing the granularity. Furthermore, when inserting flip-flops between the circuit blocks, an appropriate clock signal must be supplied to these flip-flops. Although this clock signal can be the same as a clock signal for other circuits, one pipe-line stage must be added in this case. This increases the area of the semiconductor integrated circuit.

As a related technique of this type, a semiconductor integrated circuit capable of suppressing a crowbar current in an interface circuit is disclosed (Jpn. Pat. Appln. KOKAI Publication No. 2004-165993).

BRIEF SUMMARY OF THE INVENTION

According to a first aspect of the present invention, there is provided a semiconductor integrated circuit comprising: a first circuit block which operates at a first internal voltage; a second circuit block which operates at a second internal voltage, is connected to an output stage of the first circuit block, and receives a signal from the first circuit block; and a voltage controller which supplies the first internal voltage to the first circuit block by using a first high-potential power, supplies the second internal voltage to the second circuit block by using a second high-potential power, and performs control such that the second internal voltage does not exceed the first internal voltage.

According to a second aspect of the present invention, there is provided a semiconductor integrated circuit comprising: a first circuit block which operates at a first internal voltage; a second circuit block which operates at a second internal voltage, is connected to an output stage of the first circuit block, and receives a signal from the first circuit block; and a voltage controller which supplies the first internal voltage to the first circuit block by using a first low-potential power, supplies the second internal voltage to the second circuit block by using a second low-potential power, and performs control such that the first internal voltage does not exceed the second internal voltage.

According to a third aspect of the present invention, there is provided a semiconductor integrated circuit comprising: a first circuit block which operates at a first high-potential power; a second circuit block which operates at a second high-potential power, is connected to an output stage of the first circuit block, and receives a signal from the first circuit block; and a voltage controller which controls, with respect to the first circuit block and the second circuit block, supply/shutoff of a low-potential power common to the first circuit block and the second circuit block, supplies the low-potential power to the first circuit block before the second circuit block when start of operation of the circuit blocks, and shuts off the low-potential power to the first circuit block after the second circuit block when stop of the operation.

DETAILED DESCRIPTION OF THE INVENTION

Figure 1:
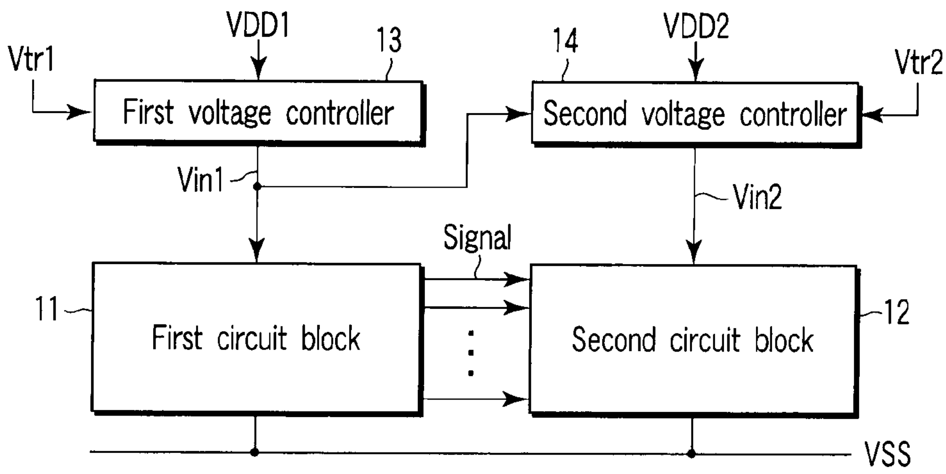
FIG. 1 is a block diagram illustrating a semiconductor integrated circuit according to the first embodiment of the present invention.

Embodiments of the present invention will be explained below with reference to the accompanying drawing. Note that in the following explanation, the same reference numerals denote elements having the same functions and arrangements, and a repetitive explanation thereof will be made only when necessary.

First Embodiment

FIG. 1 is a block diagram illustrating a semiconductor integrated circuit according to the first embodiment of the present invention. The semiconductor integrated circuit comprises a first circuit block 11, a second circuit block 12, a first voltage controller 13, and a second voltage controller 14.

Each of the first and second circuit blocks 11 and 12 circuit blocks comprises a plurality of P-channel metal oxide semiconductor (MOS) transistors, a plurality of N-channel MOS transistors, and a plurality of complementary metal oxide semiconductor (CMOS) inverters.

The first and second circuit blocks 11 and 12 are separated so as to operate at different operating power supply voltages. Note that "different power supply voltages" include a case in which voltage levels are different, and a case in which voltage levels are the same but timings at which the voltage levels change are different.

The second circuit block 12 is connected to the output stage of the first circuit block 11. The internal circuits of the first and second circuit blocks 11 and 12 are configured such that signals flow from the first circuit block 11 to the second circuit block 12.

The first voltage controller 13 is connected to the first circuit block 11 (more specifically, a high-potential power terminal of the first circuit block 11). The first voltage controller 13 receives a high-potential power supply voltage VDD1 and target voltage Vtr1. The first voltage controller 13 supplies a high-potential internal voltage Vin1 to the first circuit block 11 by using the power supply voltage VDD1 and target voltage Vtr1. The internal voltage Vin1 is used as the operating power supply voltage of the first circuit block 11.

The second voltage controller 14 is connected to the second circuit block 12 (more specifically, a high-potential power terminal of the second circuit block 12). The second voltage controller 14 receives a high-potential power supply voltage VDD2 and target voltage Vtr2. The second voltage controller

14 also receives the internal voltage Vin1. The second voltage controller 14 supplies a high-potential internal voltage Vin2 to the second circuit block 12 by using the power supply voltage VDD2, target voltage Vtr2, and internal voltage Vin1. The internal voltage Vin2 is used as the operating power supply voltage of the second circuit block 12.

The first and second circuit blocks 11 and 12 (more specifically, the low-potential power terminals of the first and second circuit blocks 11 and 12) are connected to a power line to which a low-potential power supply voltage VSS is applied. The low-potential power supply voltage VSS is, e.g., the ground voltage. Accordingly, the high level of a signal sent from the first circuit block 11 to the second circuit block 12 is set at the internal voltage Vin1, and the low level thereof is set at the power supply voltage VSS.

The operation of the semiconductor integrated circuit having the above arrangement will be explained below. The first voltage controller 13 supplies an internal voltage Vin1 equal to the target voltage Vtr1 to the first circuit block 11.

The second voltage controller 14 refers to the internal voltage Vin1. The second voltage controller 14 then supplies the internal voltage Vin2 to the second circuit block 12, so that the internal voltage Vin2 is as close to the target voltage Vtr2 as possible but does not exceed the internal voltage Vin1.

Figure 2:
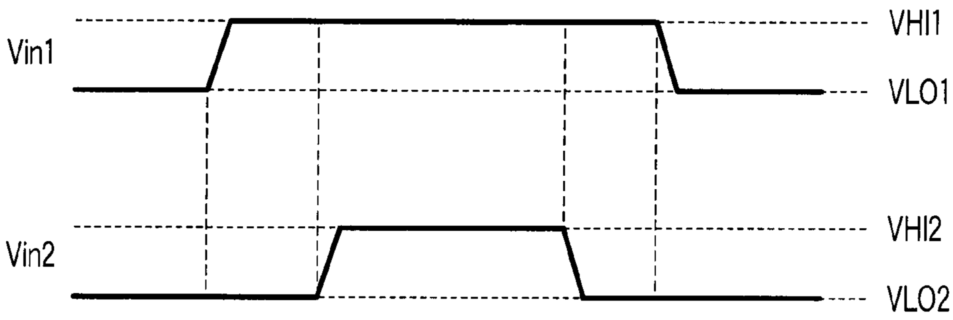
FIG. 2 is a view illustrating the voltage waveforms of internal voltages Vin1 and Vin2.

FIG. 2 is a view showing the voltage waveforms of the internal voltages Vin1 and Vin2. The first voltage controller 13 supplies the internal voltage Vin1 having the voltage waveform shown in FIG. 2 to the first circuit block 11. That is, the first voltage controller 13 changes the internal voltage Vin1 from a voltage VLO1 to a voltage VHI1 and then from the voltage VHI1 to the voltage VLO1 at the timings shown in FIG. 2.

In this case, the second voltage controller 14 raises the internal voltage Vin2 from a voltage VLO2 to a voltage VHI2 after the internal voltage Vin1 has risen from the voltage VLO1 to the voltage VHI1. Also, the second voltage controller 14 drops the internal voltage Vin2 from the voltage VHI2 to the voltage VLO2 before the internal voltage Vin1 drops from the voltage VHI1 to the voltage VLO1. The relationship between the voltages VHI1 and VHI2 is set to $VHI1 \geqq VHI2$. The relationship between the voltages VLO1 and VLO2 is set to $VLO1 \geqq VLO2$.

Since the second voltage controller 14 thus controls the internal voltage Vin2, the second circuit block 12 can receive an internal voltage Vin2 not exceeding the internal voltage Vin1.

Figure 3:
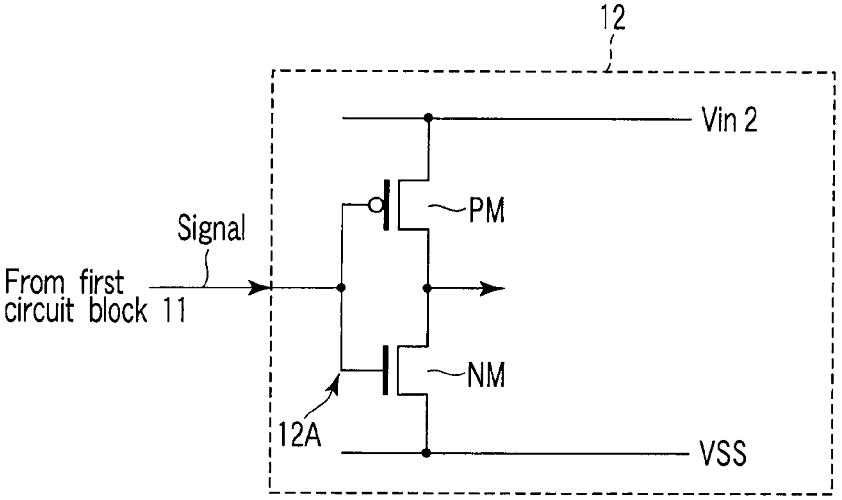
FIG. 3 is a schematic view illustrating a second circuit block 12.

If the internal voltages Vin1 and Vin2 are simultaneously changed with no such control as above, the possibility that the internal voltage Vin1 becomes lower than the internal voltage Vin2 cannot be eliminated. FIG. 3 is a schematic view of the second circuit block 12. As described above, the second circuit block 12 includes a CMOS inverter 12A. The CMOS inverter 12A comprises a P-channel MOS transistor PM and N-channel MOS transistor NM in series. Note that the first circuit block 11 also includes a CMOS inverter identical to that of the second circuit block 12 as described above.

In this configuration, if the internal voltage Vin1 becomes lower than the internal voltage Vin2, a gate-to-source voltage Vgs applied to the transistor PM becomes negative and a gate-to-source voltage Vgs applied to the transistor NM becomes positive in the forefront stage of the second circuit block 12 which receives signals from the first circuit block 11.

If a bias like this is applied to the CMOS inverter 12A, a crowbar current (short-circuit current) flows through the circuit block via the CMOS inverter 12A. As described above, however, it is possible to prevent a crowbar current in the circuit block by controlling the internal voltage Vin2 so as not to exceed the internal voltage Vin1.

Figure 4:
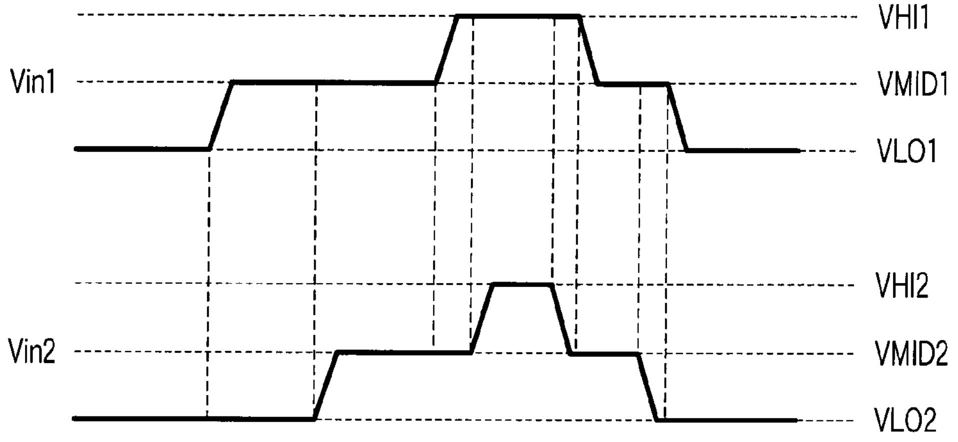
FIG. 4 is a view illustrating other voltage waveforms of the internal voltages Vin1 and Vin2.

It is also possible to change the internal voltages Vin1 and Vin2 to three or more levels. FIG. 4 is a view showing other voltage waveforms of the internal voltages Vin1 and Vin2.

The first voltage controller 13 supplies the internal voltage Vin1 having the voltage waveform shown in FIG. 4 to the first circuit block 11. That is, the first voltage controller 13 changes the internal voltage Vin1 from the voltage VLO1 to a voltage VMID1 and then from the voltage VMID1 to the voltage VHI1 at the timings shown in FIG. 4. Also, the first voltage controller 13 changes the internal voltage Vin1 from the voltage VHI1 to the voltage VMID1 and then from the voltage VMID1 to the voltage VLO1 at the timings shown in FIG. 4.

In this case, the second voltage controller 14 raises the internal voltage Vin2 from the voltage VLO2 to a voltage VMID2 after the internal voltage Vin1 has risen from the voltage VLO1 to the voltage VMID1. Then, the second voltage controller 14 raises the internal voltage Vin2 from the voltage VMID2 to the voltage VHI2 after the internal voltage Vin1 has risen from the voltage VMID1 to the voltage VHI1. The relationship between the voltages VHI1 and VHI2 is set to VHI1≧VHI2. The relationship between the voltages VMID1 and VMID2 is set to VMID1≧VMID2. The relationship between the voltages VLO1 and VLO2 is set to VLO1≧VLO2.

Also, the second voltage controller 14 drops the internal voltage Vin2 from the voltage VHI2 to the voltage VMID2 before the internal voltage Vin1 drops from the voltage VHI1 to the voltage VMID1. Then, the second voltage controller 14 drops the internal voltage Vin2 from the voltage VMID2 to the voltage VLO2 before the internal voltage Vin1 drops from the voltage VMID1 to the voltage VLO1.

Since the second voltage controller 14 thus controls the internal voltage Vin2, the second circuit block 12 can receive an internal voltage Vin2 not exceeding the internal voltage Vin1.

Figure 5:
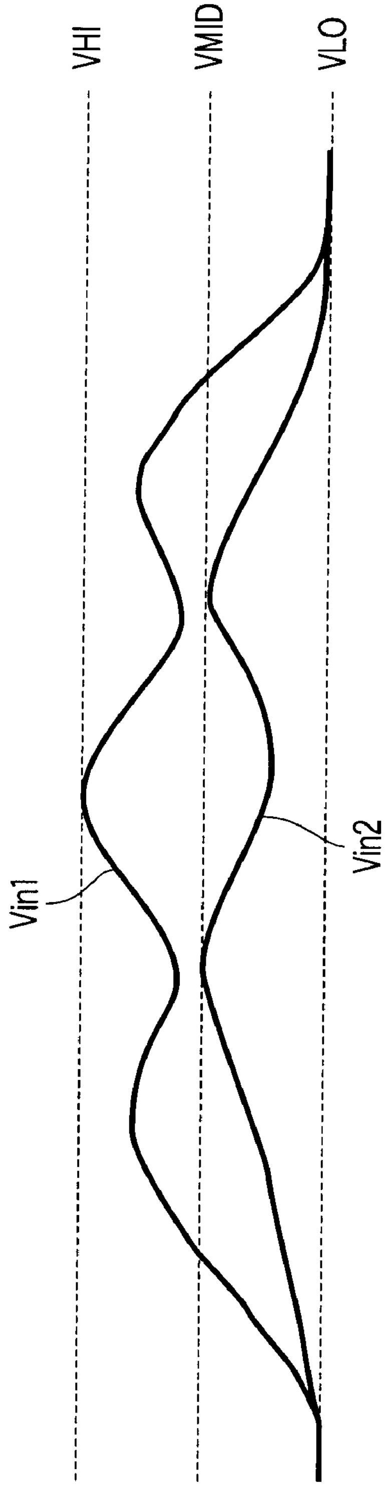
FIG. 5 is a view illustrating still other voltage waveforms of the internal voltages Vin1 and Vin2.

Furthermore, the internal voltages Vin1 and Vin2 can also be continuously changed. FIG. 5 is a view showing still other voltage waveforms of the internal voltages Vin1 and Vin2.

The first voltage controller 13 supplies the internal voltage Vin1 that continuously changes to the first circuit block 11 at the timings shown in FIG. 5. In this case, the second voltage controller 14 refers to the internal voltage Vin1, and supplies the internal voltage Vin2 to the second circuit block 12 such that the internal voltage Vin2 does not exceed the internal voltage Vin1.

As described in detail above, in a semiconductor integrated circuit comprising a plurality of circuit blocks which operate at different power supply voltages, this embodiment can prevent a crowbar current between the circuit blocks and in each circuit block.

This embodiment also obviates the need to form any latch circuits, flip-flops, level converters, or the like as interface circuits between the circuit blocks. As a consequence, the area of the semiconductor integrated circuit can be reduced.

Figure 6:
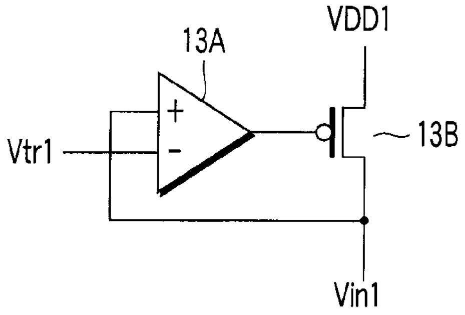
FIG. 6 is a circuit diagram illustrating the arrangement of a first voltage controller 13 shown in FIG. 1.

Examples of the circuit configurations of the first and second voltage controllers 13 and 14 will be explained below. FIG. 6 is a circuit diagram illustrating the arrangement of the first voltage controller 13. The first voltage controller 13 comprises a comparator 13A and P-channel MOS transistor (PMOS transistor) 13B.

The comparator 13A receives the target voltage Vtr1 at its negative input terminal. The output terminal of the comparator 13A is connected to the gate terminal of the PMOS transistor 13B. The PMOS transistor 13B receives the high-potential power supply voltage VDD1 at its source terminal. The drain terminal of the PMOS transistor 13B is connected to the positive input terminal of the comparator 13A.

The drain terminal of the PMOS transistor 13B is also connected to the first circuit block 11. That is, the PMOS transistor 13B outputs the high-potential internal voltage Vin1 from its drain terminal.

The comparator 13A compares the internal voltage Vin1 with the target voltage Vtr1. The comparator 13A then supplies a signal based on the difference between the internal voltage Vin1 and target voltage Vtr1 to the gate terminal of the PMOS transistor 13B. The first voltage controller 13 having this arrangement can supply an internal voltage Vin1 equal to the target voltage Vtr1 to the first circuit block 11.

Figure 7:
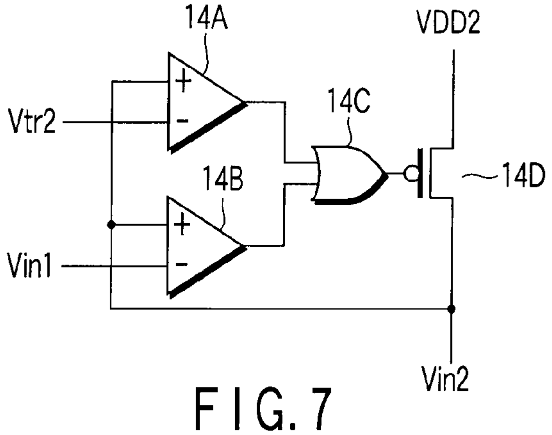
FIG. 7 is a circuit diagram illustrating the arrangement of a second voltage controller 14 shown in FIG. 1.

FIG. 7 is a circuit diagram showing the arrangement of the second voltage controller 14. The second voltage controller 14 comprises comparators 14A and 14B, an OR circuit 14C, and a PMOS transistor 14D.

The comparator 14A receives the target voltage Vtr2 at its negative input terminal. The output terminal of the comparator 14A is connected to one input terminal of the OR circuit 14C. The comparator 14B receives the internal voltage Vin1 at its negative input terminal. The output terminal of the comparator 14B is connected to the other input terminal of the OR circuit 14C.

The output terminal of the OR circuit 14C is connected to the gate terminal of the PMOS transistor 14D. The PMOS transistor 14D receives the high-potential power supply voltage VDD2 at its source terminal. The drain terminal of the PMOS transistor 14D is connected to the positive input terminals of the comparators 14A and 14B.

The drain terminal of the PMOS transistor 14D is connected to the second circuit block 12. That is, the PMOS transistor 14D outputs the high-potential internal voltage Vin2 from its drain terminal.

The comparator 14A compares the internal voltage Vin2 with the target voltage Vtr2. The comparator 14A then supplies a signal based on the difference between the internal voltage Vin2 and target voltage Vtr2 to the OR circuit 14C. The comparator 14B compares the internal voltages Vin1 and Vin2. The comparator 14B then supplies a signal based on the difference between the internal voltages Vin1 and Vin2 to the OR circuit 14C.

The OR circuit 14C supplies a sum signal of the output signals from the comparators 14A and 14B to the gate terminal of the PMOS transistor 14D. The second voltage controller 14 having this arrangement can supply, to the second circuit block 12, an internal voltage Vin2 which is as close to the target voltage Vtr2 as possible but does not exceed the internal voltage Vin1.

Second Embodiment

In the second embodiment, a first voltage controller 13 controls a high-potential internal voltage Vin1 so that it is equal to or higher than a high-potential internal voltage Vin2.

Figure 8:
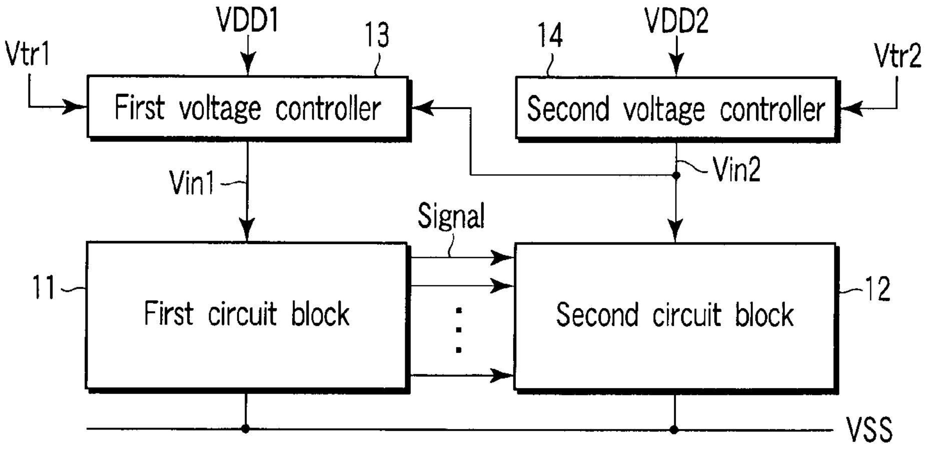
FIG. 8 is a block diagram illustrating a semiconductor integrated circuit according to the second embodiment of the present invention.

FIG. 8 is a block diagram illustrating a semiconductor integrated circuit according to the second embodiment of the present invention. A second voltage controller 14 receives a high-potential power supply voltage VDD2 and target voltage Vtr2. The second voltage controller 14 supplies the high-potential internal voltage Vin2 to a second circuit block 12 by using the power supply voltage VDD2 and target voltage Vtr2.

The first voltage controller 13 receives a high-potential power supply voltage VDD1, a target voltage Vtr1, and the high-potential internal voltage Vin2. The first voltage controller 13 supplies the high-potential internal voltage Vin1 to a first circuit block 11 by using the power supply voltage VDD1, target voltage Vtr1, and internal voltage Vin2.

The operation of the semiconductor integrated circuit having the above arrangement will be explained below. The second voltage controller 14 supplies an internal voltage Vin2 equal to the target voltage Vtr2 to the second circuit block 12.

The first voltage controller 13 refers to the internal voltage Vin2. The first voltage controller 13 then supplies the internal voltage Vin1 to the first circuit block 11, such that the internal voltage Vin1 is as close to the target voltage Vtr1 as possible but is equal to or higher than the internal voltage Vin2.

The voltage waveforms of the internal voltages Vin1 and Vin2 of this embodiment are the same as those shown in FIG. 2 explained in the first embodiment. As shown in FIG. 2, the second voltage controller 114 supplies an internal voltage Vin2 having the voltage waveform shown in FIG. 2 to the second circuit block 12. That is, the second voltage controller 14 changes the internal voltage Vin2 from a voltage VLO2 to a voltage VHI2 and then from the VHI2 to the voltage VLO2 at the timings shown in FIG. 2.

In this case, the first voltage controller 13 raises the internal voltage Vin1 from a voltage VLO1 to a voltage VHI1 before the internal voltage Vin2 rises from the voltage VLO2 to the voltage VHI2. Also, the first voltage controller 13 drops the internal voltage Vin1 from the voltage VHI1 to the voltage VLO1 after the internal voltage Vin2 has dropped from the voltage VHI2 to the voltage VLO2. The relationship between the voltages VHI1 and VHI2 is set to VHI1≧VHI2. The relationship between the voltages VLO1 and VLO2 is set to VLO1≧VLO2.

Since the first voltage controller 13 thus controls the internal voltage Vin1, the first circuit block 11 can receive an internal voltage Vin1 equal to or higher than the internal voltage Vin2. Note that the internal voltages Vin1 and Vin2 can also be controlled as indicated by the other voltage waveforms (FIGS. 4 and 5) explained in the first embodiment.

Third Embodiment

Figure 9:
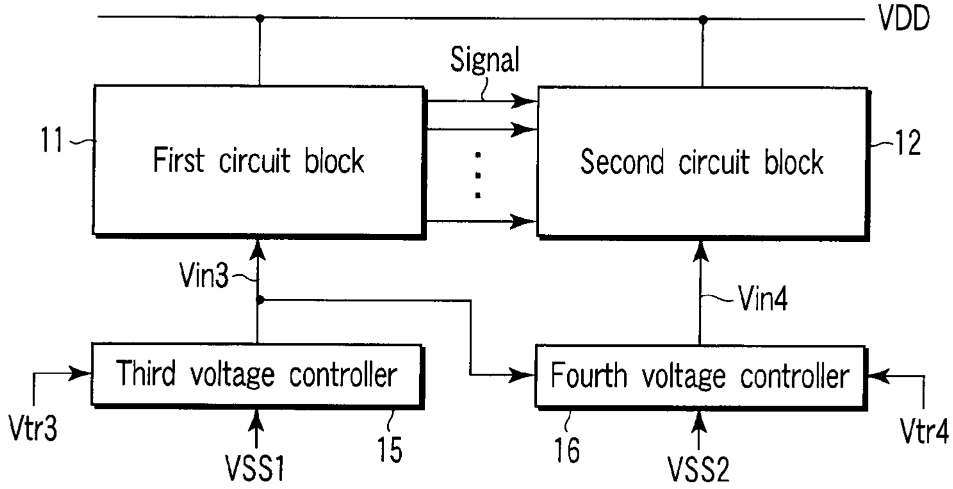
FIG. 9 is a block diagram illustrating a semiconductor integrated circuit according to the third embodiment of the present invention.

The third embodiment prevents a crowbar current in a semiconductor integrated circuit by controlling low-potential power supply voltages VSS. FIG. 9 is a block diagram illustrating the semiconductor integrated circuit according to the third embodiment of the present invention.

A third voltage controller 15 is connected to a first circuit block 11 (more specifically, the low-potential power terminal of the first circuit block 11). The third voltage controller 15 receives a low-potential power supply voltage VSS1 and target voltage Vtr3. The third voltage controller 15 supplies a low-potential internal voltage Vin3 to the first circuit block 11 by using the power supply voltage VSS1 and target voltage Vtr3. The internal voltage Vin3 is used as the operating power supply voltage of the first circuit block 11.

A fourth voltage controller 16 is connected to a second circuit block 12 (more specifically, the low-potential power terminal of the second circuit block 12). The fourth voltage controller 16 receives a low-potential power supply voltage VSS2 and target voltage Vtr4. The fourth voltage controller 16 also receives the internal voltage Vin3. The fourth voltage controller 16 supplies a low-potential internal voltage Vin4 to the second circuit block 12 by using the power supply voltage VSS2, target voltage Vtr4, and internal voltage Vin3. The internal voltage Vin4 is used as the operating power supply voltage of the second circuit block 12.

The first and second circuit blocks 11 and 12 (more specifically, the high-potential power terminals of the first and second circuit blocks 11 and 12) are connected to a power line to which a high-potential power supply voltage VDD is applied.

The operation of the semiconductor integrated circuit having the above arrangement will be explained below. The third voltage controller 15 supplies an internal voltage Vin3 equal to the target voltage Vtr3 to the first circuit block 11.

The fourth voltage controller 16 refers to the internal voltage Vin3. The fourth voltage controller 16 then supplies the internal voltage Vin4 to the second circuit block 12, so that the internal voltage Vin4 is as close to the target voltage Vtr4 as possible but is equal to or higher than the internal voltage Vin3.

Figure 10:
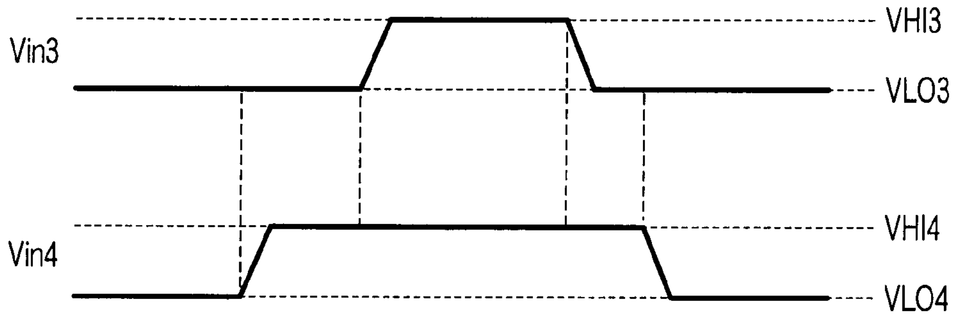
FIG. 10 is a view illustrating the voltage waveforms of internal voltages Vin3 and Vin4.

FIG. 10 is a view showing the voltage waveforms of the internal voltages Vin3 and Vin4. The third voltage controller 15 supplies an internal voltage Vin3 having the voltage waveform shown in FIG. 10 to the first circuit block 11. That is, the third voltage controller 15 changes the internal voltage Vin3 from a voltage VLO3 to a voltage VHI3 and then from the voltage VHI3 to the voltage VLO3 at the timings shown in FIG. 10.

In this case, the fourth voltage controller 16 raises the internal voltage Vin4 from a voltage VLO4 to a voltage VHI4 before the internal voltage Vin3 rises from the voltage VLO3 to the voltage VHI3. Also, the fourth voltage controller 16 drops the internal voltage Vin4 from the voltage VHI4 to the voltage VLO4 after the internal voltage Vin3 has dropped from the voltage VHI3 to the voltage VLO3. The relationship between the voltages VHI3 and VHI4 is set to VHI4≧VHI3. The relationship between the voltages VLO3 and VLO4 is set to VLO4≧VLO3.

Since the fourth voltage controller 16 thus controls the internal voltage Vin4, the second circuit block 12 can receive an internal voltage Vin4 equal to or higher than the internal voltage Vin3. This makes it possible to prevent a crowbar current in the second circuit block 12.

Figure 11:
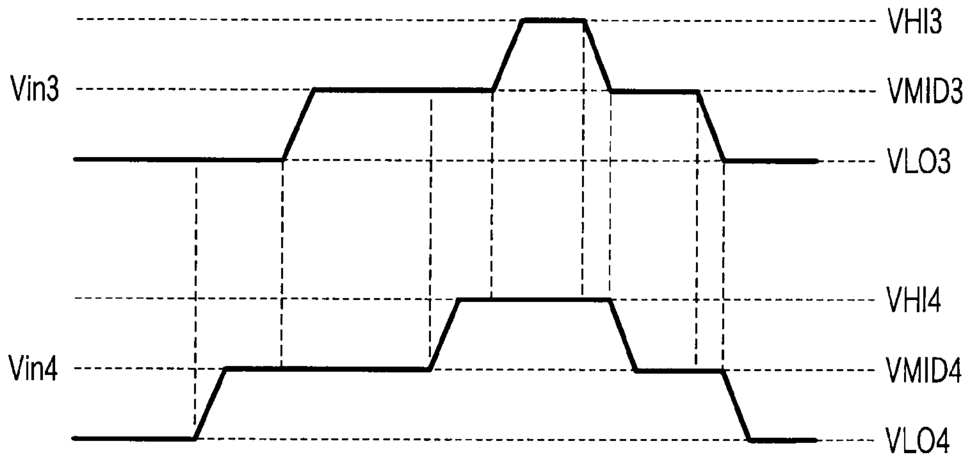
FIG. 11 is a view illustrating other voltage waveforms of the internal voltages Vin3 and Vin4.

It is also possible to change the internal voltages Vin3 and Vin4 to three or more levels. FIG. 11 is a view showing other voltage waveforms of the internal voltages Vin3 and Vin4.

The third voltage controller 15 supplies an internal voltage Vin3 having the voltage waveform shown in FIG. 11 to the first circuit block 11. That is, the third voltage controller 15 changes the internal voltage Vin3 from the voltage VLO3 to a voltage VMID3 and then from the voltage VMID3 to the voltage VHI3 at the timings shown in FIG. 11. Also, the third voltage controller 15 changes the internal voltage Vin3 from the voltage VHI3 to the voltage VMID3 and then from the voltage VMID3 to the voltage VLO3 at the timings shown in FIG. 11.

In this case, the fourth voltage controller 16 raises the internal voltage Vin4 from the voltage VLO4 to a voltage VMID4 before the internal voltage Vin3 rises from the voltage VLO3 to the voltage VMID3. Then, the fourth voltage controller 16 raises the internal voltage Vin4 from the voltage VMID4 to the voltage VHI4 before the internal voltage Vin3 rises from the voltage VMID3 to the voltage VHI3. The relationship between the voltages VHI3 and VHI4 is set to VHI4≧VHI3. The relationship between the voltages VMID3 and VMID4 is set to VMID4≧VMID3. The relationship between the voltages VLO3 and VLO4 is set to VLO4≧VLO3.

Also, the fourth voltage controller 16 drops the internal voltage Vin4 from the voltage VHI4 to the voltage VMID4 after the internal voltage Vin3 has dropped from the voltage VHI3 to the voltage VMID3. Then, the fourth voltage controller 16 drops the internal voltage Vin4 from the voltage VMID4 to the voltage VLO4 after the internal voltage Vin3 has dropped from the voltage VMID3 to the voltage VLO3.

Since the fourth voltage controller 16 thus controls the internal voltage Vin4, the second circuit block 12 can receive an internal voltage Vin4 equal to or higher than the internal voltage Vin3.

Figure 12:
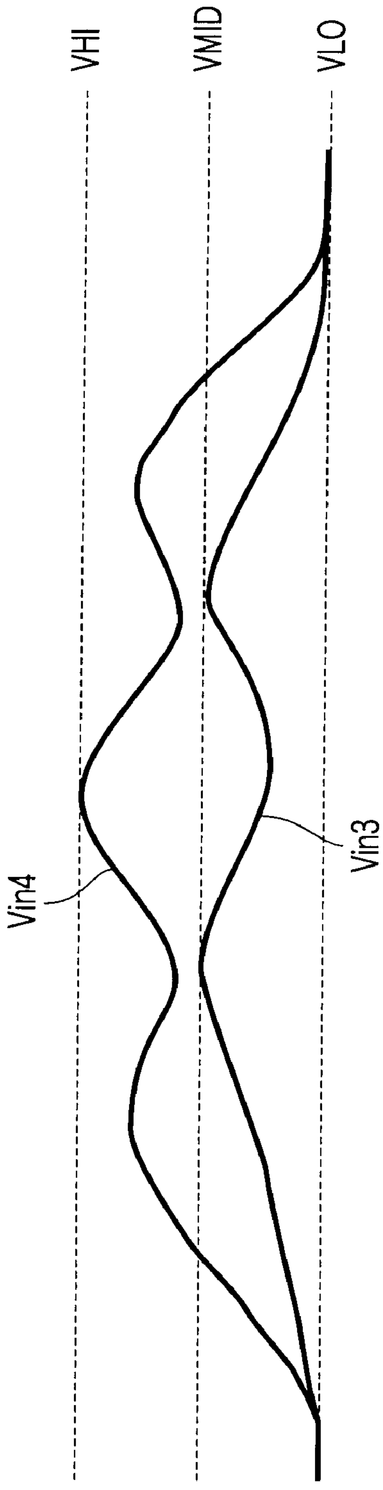
FIG. 12 is a view illustrating still other voltage waveforms of the internal voltages Vin3 and Vin4.

Furthermore, the internal voltages Vin3 and Vin4 can also be continuously changed. FIG. 12 is a view showing still other voltage waveforms of the internal voltages Vin3 and Vin4.

The third voltage controller 15 supplies an internal voltage Vin3 that continuously changes to the first circuit block 11 at the timings shown in FIG. 12. In this case, the fourth voltage controller 16 refers to the internal voltage Vin3, and supplies the internal voltage Vin4 to the second circuit block 12 such that the internal voltage Vin4 is equal to or higher than the internal voltage Vin3.

As described in detail above, this embodiment can prevent a crowbar current between the circuit blocks and in each circuit block by controlling the low-potential power supply voltage VSS.

Fourth Embodiment

In the fourth embodiment, a third voltage controller 15 controls an internal voltage Vin3 so that it does not exceed an internal voltage Vin4.

Figure 13:
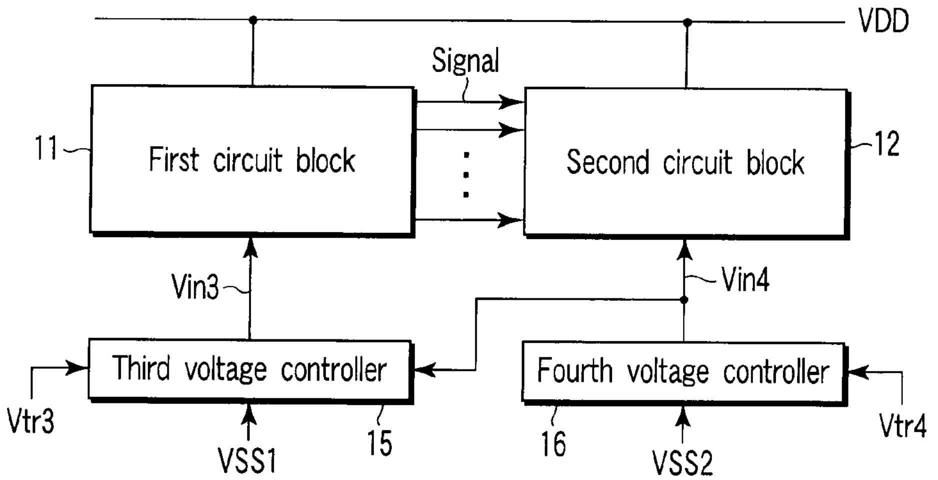
FIG. 13 is a block diagram illustrating a semiconductor integrated circuit according to the fourth embodiment of the present invention.

FIG. 13 is a block diagram illustrating a semiconductor integrated circuit according to the fourth embodiment of the present invention. A fourth voltage controller 16 receives a low-potential power supply voltage VSS2 and target voltage Vtr4. The fourth voltage controller 16 supplies the low-potential internal voltage Vin4 to a second circuit block 12 by using the power supply voltage VSS2 and target voltage Vtr4.

The third voltage controller 15 receives a low-potential power supply voltage VSS1, a target voltage Vtr3, and the low-potential internal voltage Vin4. The third voltage controller 15 supplies the low-potential internal voltage Vin3 to a first circuit block 11 by using the power supply voltage VSS1, target voltage Vtr3, and internal voltage Vin4.

The operation of the semiconductor integrated circuit having the above arrangement will be explained below. The fourth voltage controller 16 supplies an internal voltage Vin4 equal to the target voltage Vtr4 to the second circuit block 12.

The third voltage controller 15 refers to the internal voltage Vin4. The third voltage controller 15 then supplies the internal voltage Vin3 to the first circuit block 11, such that the internal voltage Vin3 is as close to the target voltage Vtr3 as possible but does not exceed the internal voltage Vin4.

The voltage waveforms of the internal voltages Vin3 and Vin4 of this embodiment are the same as those shown in FIG. 10 explained in the third embodiment. The fourth voltage controller 16 supplies an internal voltage Vin4 having the voltage waveform shown in FIG. 10 to the second circuit block 12. That is, the fourth voltage controller 16 changes the internal voltage Vin4 from a voltage VLO4 to a voltage VHI4 and then from the voltage VHI4 to the voltage VLO4 at the timings shown in FIG. 10.

In this case, the third voltage controller 15 raises the internal voltage Vin3 from a voltage VLO3 to a voltage VHI3 after the internal voltage Vin4 has risen from the voltage VLO4 to the voltage VHI4. Also, the third voltage controller 15 drops the internal voltage Vin3 from the voltage VHI3 to the voltage VLO3 before the internal voltage Vin4 drops from the voltage VHI4 to the voltage VLO4. The relationship between the voltages VHI3 and VHI4 is set to VHI4≧VHI3. The relationship between the voltages VLO3 and VLO4 is set to VLO4≧VLO3.

Since the third voltage controller 15 thus controls the internal voltage Vin3, the first circuit block 11 can receive an internal voltage Vin3 not exceeding the internal voltage Vin4. Note that the internal voltages Vin3 and Vin4 can also be controlled as indicated by the other voltage waveforms (FIGS. 11 and 12) explained in the third embodiment.

Figure 14:
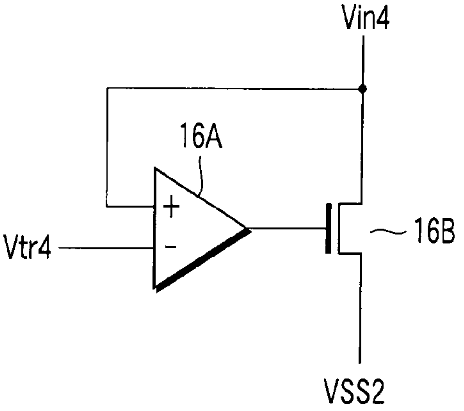
FIG. 14 is a circuit diagram illustrating the arrangement of a fourth voltage controller 16 shown in FIG. 13.

Examples of the circuit configurations of the third and fourth voltage controllers 15 and 16 will be explained below. FIG. 14 is a circuit diagram illustrating the arrangement of the fourth voltage controller 16. The fourth voltage controller 16 comprises a comparator 16A and N-channel MOS (NMOS) transistor 16B.

The comparator 16A receives the target voltage Vtr4 at its negative input terminal. The output terminal of the comparator 16A is connected to the gate terminal of the NMOS transistor 16B. The NMOS transistor 16B receives the low-potential power supply voltage VSS2 at its source terminal. The drain terminal of the NMOS transistor 16B is connected to the positive input terminal of the comparator 16A.

The drain terminal of the NMOS transistor 16B is also connected to the second circuit block 12. That is, the NMOS transistor 16B outputs the low-potential internal voltage Vin4 from its drain terminal.

The comparator 16A compares the internal voltage Vin4 with the target voltage Vtr4. The comparator 16A then supplies a signal based on the difference between the internal voltage Vin4 and target voltage Vtr4 to the gate terminal of the NMOS transistor 16B. The fourth voltage controller 16 having this arrangement can supply an internal voltage Vin4 equal to the target voltage Vtr4 to the second circuit block 12.

Figure 15:
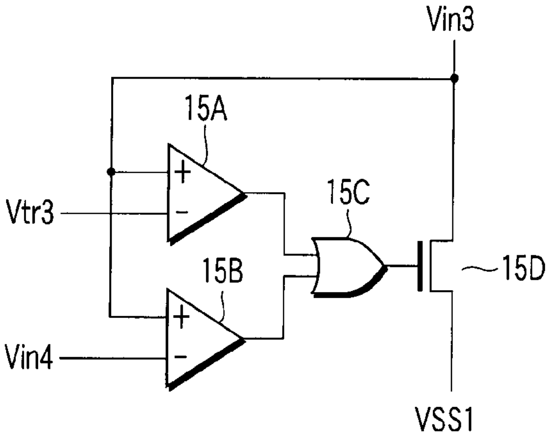
FIG. 15 is a circuit diagram illustrating the arrangement of a third voltage controller 15 shown in FIG. 13.

FIG. 15 is a circuit diagram showing the arrangement of the third voltage controller 15. The third voltage controller 15 comprises comparators 15A and 15B, an OR circuit 15C, and an NMOS transistor 15D.

The comparator 15A receives the target voltage Vtr3 at its negative input terminal. The output terminal of the comparator 15A is connected to one input terminal of the OR circuit 15C. The comparator 15B receives the internal voltage Vin4 at its negative input terminal. The output terminal of the comparator 15B is connected to the other input terminal of the OR circuit 15C.

The output terminal of the OR circuit 15C is connected to the gate terminal of the NMOS transistor 15D. The NMOS transistor 15D receives the low-potential power supply voltage VSS1 at its source terminal. The drain terminal of the NMOS transistor 15D is connected to the positive input terminals of the comparators 15A and 15B.

The drain terminal of the NMOS transistor 15D is also connected to the first circuit block 11. That is, the NMOS transistor 15D outputs the low-potential internal voltage Vin3 from its drain terminal.

The comparator 15A compares the internal voltage Vin3 with the target voltage Vtr3. The comparator 15A then supplies a signal based on the difference between the internal voltage Vin3 and target voltage Vtr3 to the OR circuit 15C. The comparator 15B compares the internal voltages Vin3 and Vin4. The comparator 15B then supplies a signal based on the difference between the internal voltages Vin3 and Vin4 to the OR circuit 15C.

The OR circuit 15C supplies a sum signal of the output signals from the comparators 15A and 15B to the gate terminal of the NMOS transistor 15D. The third voltage controller 15 having this arrangement can supply, to the first circuit block 11, an internal voltage Vin3 which is as close to the target voltage Vtr3 as possible but does not exceed the internal voltage Vin4.

Fifth Embodiment

The fifth embodiment controls supply and shutoff of high-potential power supply voltages to first and second circuit blocks 11 and 12, thereby preventing a crowbar current between the circuit blocks and in each circuit block.

Figure 16:
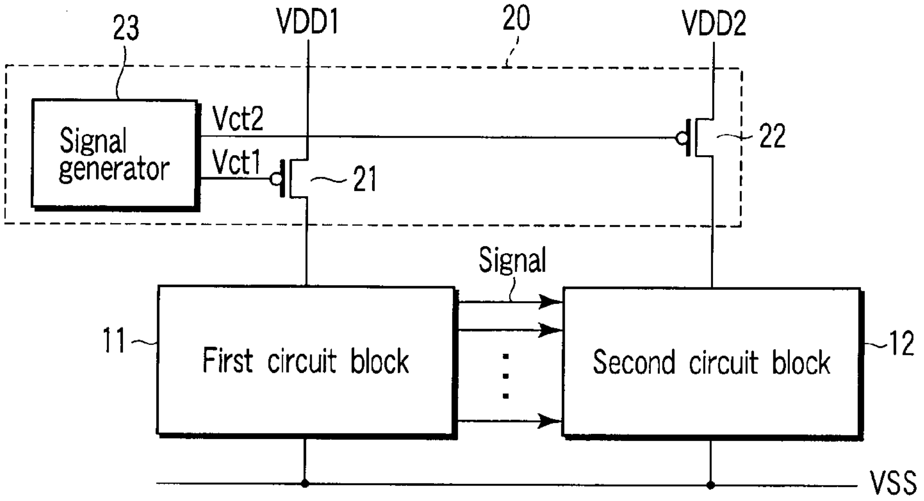
FIG. 16 is a block diagram illustrating a semiconductor integrated circuit according to the fifth embodiment of the present invention.

FIG. 16 is a block diagram illustrating a semiconductor integrated circuit according to the fifth embodiment of the present invention. This semiconductor integrated circuit comprises the first and second circuit blocks 11 and 12 and a voltage controller 20. The voltage controller 20 comprises PMOS transistors 21 and 22 as switching elements and a signal generator 23.

The PMOS transistor 21 receives a high-potential power supply voltage VDD1 at its source terminal. The drain terminal of the PMOS transistor 21 is connected to the first circuit block 11. The PMOS transistor 22 receives a high-potential power supply voltage VDD2 at its source terminal. The drain terminal of the PMOS transistor 22 is connected to the second circuit block 12. The relationship between the power supply voltages VDD1 and VDD2 is set to VDD1≧VDD2.

The signal generator 23 generates control signals Vct1 and Vct2. The control signal Vct1 is input to the gate terminal of the PMOS transistor 21. The control signal Vct2 is input to the gate terminal of the PMOS transistor 22.

The operation of the semiconductor integrated circuit having the above arrangement will be explained below. The voltage controller 20 supplies the power supply voltages VDD1 and VDD2 to the first and second circuit blocks 11 and 12, or shuts off the power supply voltages VDD1 and VDD2 to the first and second circuit blocks 11 and 12, respectively.

In addition, the voltage controller 20 controls the power supply voltage VDD2 supplied to the second circuit block 12 so as not to exceed the power supply voltage VDD1 supplied to the first circuit block 11. More specifically, when start of operation of the first and second circuit blocks 11 and 12, the voltage controller 20 supplies the power supply voltage VDD1 to the first circuit block 11 before the power supply voltage VDD2. Also, when stop of the operation of the first and second circuit blocks 11 and 12, the voltage controller 20 shuts off the power supply voltage VDD2 before the power supply voltage VDD1.

Figure 17:
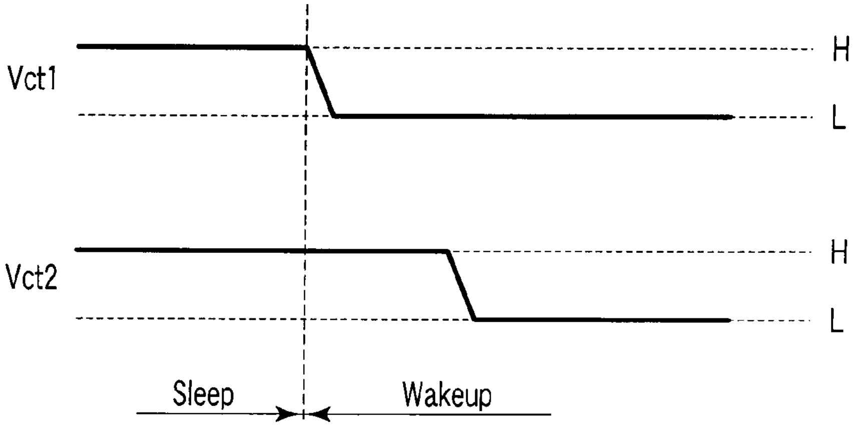
FIG. 17 is a timing chart of control signals Vct1 and Vct2 when a power supply voltage is applied.

FIG. 17 is a timing chart of the control signals Vct1 and Vct2 when the power supply voltages are applied (switched from a sleep state to a wakeup state). Note that the wakeup state is a state (power supply state) in which the power supply voltage is supplied to the circuit block. The sleep state is a state (power shutoff state) in which the supply of the power supply voltage to the circuit block is shut off.

In the sleep state, the signal generator 23 generates High-level control signals Vct1 and Vct2. The control signals Vct1 and Vct2 are respectively input to the gate terminals of the PMOS transistors 21 and 22. In the sleep state, therefore, both the PMOS transistors 21 and 22 are kept off. Consequently, the supply of the power supply voltages VDD1 and VDD2 to the first and second circuit blocks 11 and 12 is shut off.

When start of the operation, the signal generator 23 first changes the control signal Vct1 to low level. This turns on the PMOS transistor 21 to supply the power supply voltage VDD1 to the first circuit block 11.

After that, the signal generator 23 changes the control signal Vct2 to low level. This turns on the PMOS transistor 22 to supply the power supply voltage VDD2 to the second circuit block 12.

Figure 18:
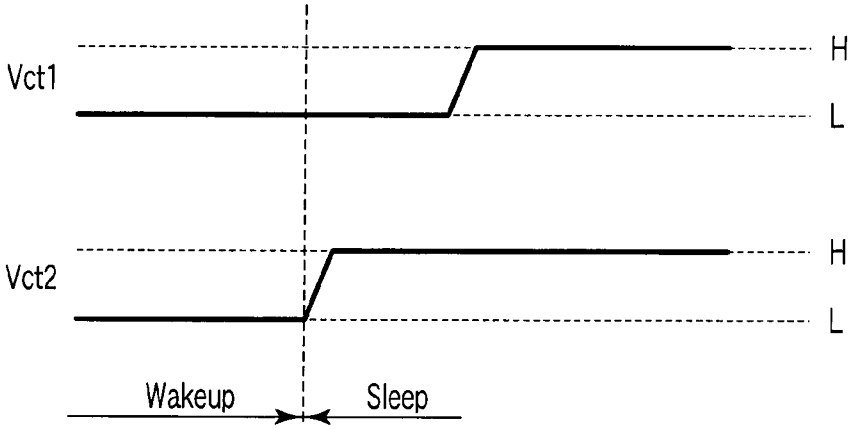
FIG. 18 is a timing chart of the control signals Vct1 and Vct2 when the power supply voltage is shut off.

FIG. 18 is a timing chart of the control signals Vct1 and Vct2 when the power supply voltages are shut off (switched from the wakeup state to the sleep state).

In the wakeup state, the signal generator 23 generates low-level control signals Vct1 and Vct2. The control signals Vct1 and Vct2 are respectively input to the gate terminals of the PMOS transistors 21 and 22. In the wakeup state, therefore, the PMOS transistors 21 and 22 are kept on. Consequently, the first and second circuit blocks 11 and 12 respectively receive the power supply voltages VDD1 and VDD2.

When stop of the operation, the signal generator 23 first changes the control signal Vct2 to high level. This turns off the PMOS transistor 22 to shut off the supply of the power supply voltage VDD2 to the second circuit block 12.

After that, the signal generator 23 changes the control signal Vct1 to high level. This turns off the PMOS transistor 21 to shut off the supply of the power supply voltage VDD1 to the first circuit block 11. By thus controlling the control signals Vct1 and Vct2, it is possible to prevent the output signal of the first circuit block 11 in the power shutoff state from being supplied to the second circuit block 12.

If the control signals Vct1 and Vct2 are simultaneously changed with no such control as above, when the voltage lowers in the first circuit block 11 because the power supply voltage VDD1 is shut off, the possibility that the second circuit block 12 receives a signal having this low voltage cannot be eliminated. In this case, a crowbar current flows through the second circuit block 12.

This embodiment, however, supplies the power supply voltage VDD2 after the power supply voltage VDD1, and shuts off the power supply voltage VDD2 before the power supply voltage VDD1. This makes it possible to prevent the second circuit block 12 from receiving a signal having a voltage lower than the power supply voltage VDD1, thereby preventing a crowbar current in the second circuit block 12.

Also, when the power supply voltage VDD1 is shut off, no power supply voltage VDD2 is supplied to the second circuit block 12. Accordingly, a crowbar current in the second circuit block 12 can be prevented.

Figure 19:
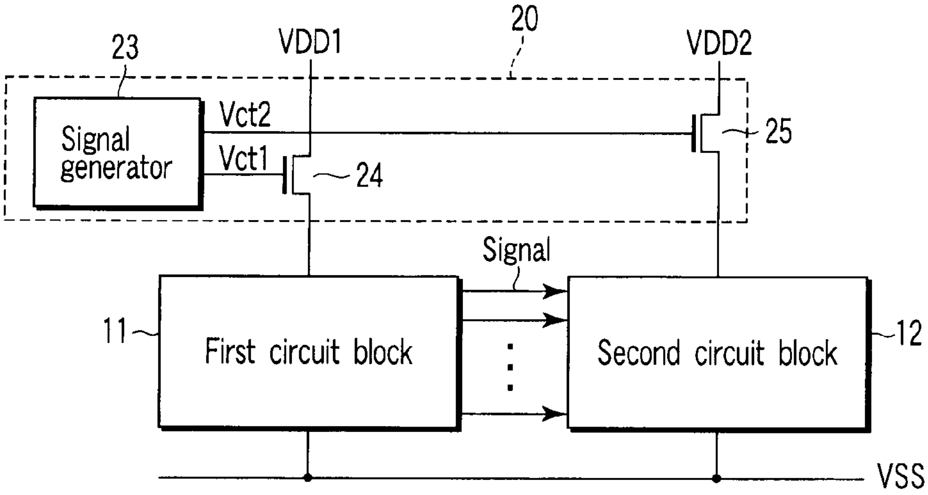
FIG. 19 is a block diagram illustrating another example of the arrangement of the semiconductor integrated circuit according to the fifth embodiment of the present invention.

Note that the switching elements for connecting/disconnecting the current path between the power supply voltage VDD1 and first circuit block 11 and the current path between the power supply voltage VDD2 and second circuit block 12 may also be formed by N-channel MOS transistors. FIG. 19 is a block diagram illustrating another example of the arrangement of the semiconductor integrated circuit according to this embodiment.

A voltage controller 20 comprises NMOS transistors 24 and 25 and a signal generator 23. The NMOS transistor 24 receives a high-potential power supply voltage VDD1 at its drain terminal. The source terminal of the NMOS transistor 24 is connected to a first circuit block 11. A control signal Vct1 is input to the gate terminal of the NMOS transistor 24. The NMOS transistor 25 receives a high-potential power supply voltage VDD2 at its drain terminal. The source terminal of the NMOS transistor 25 is connected to a second circuit block 12. A control signal Vct2 is input to the gate terminal of the NMOS transistor 25.

The signal generator 23 changes the control signals Vct1 and Vct2 at the same timings as shown in FIGS. 17 and 18. Note that in the configuration shown in FIG. 19, the control signals Vct1 and Vct2 are supplied to the NMOS transistors, so the logic of these control signals is opposite to that shown in FIGS. 17 and 18.

Even when the voltage controller 20 is formed as shown in FIG. 19, a crowbar current can be prevented in the semiconductor integrated circuit.

Sixth Embodiment

The sixth embodiment prevents a crowbar current between circuit blocks and in each circuit block by controlling the supply and shutoff timings of a low-potential power supply voltage VSS.

Figure 20:
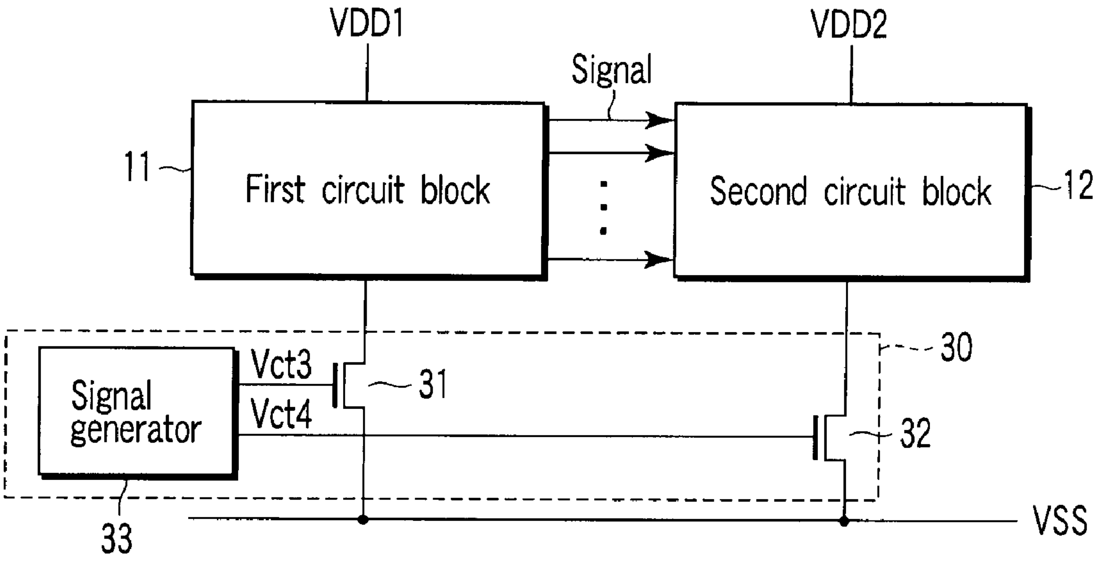
FIG. 20 is a block diagram illustrating a semiconductor integrated circuit according to the sixth embodiment of the present invention.

FIG. 20 is a block diagram illustrating a semiconductor integrated circuit according to the sixth embodiment of the present invention. This semiconductor integrated circuit comprises first and second circuit blocks 11 and 12 and a voltage controller 30.

The first circuit block 11 receives a high-potential power supply voltage VDD1. The second circuit block 12 receives a high-potential power supply voltage VDD2. The relationship between the power supply voltages VDD1 and VDD2 is set to VDD1≧VDD2.

The voltage controller 30 includes NMOS transistors 31 and 32 and a signal generator 33. The NMOS transistor 31 receives the low-potential power supply voltage VSS at its source terminal. The drain terminal of the NMOS transistor 31 is connected to the first circuit block 11 (more specifically, the low-potential power terminal of the first circuit block 11). The NMOS transistor 32 receives the low-potential power supply voltage VSS at its source terminal. The drain terminal of the NMOS transistor 32 is connected to the second circuit block 12 (more specifically, the low-potential power terminal of the second circuit block 12).

The signal generator 33 generates control signals Vct3 and Vct4. The control signal Vct3 is input to the gate terminal of the NMOS transistor 31. The control signal Vct4 is input to the gate terminal of the NMOS transistor 32.

The operation of the semiconductor integrated circuit having the above arrangement will be explained below. The voltage controller 30 supplies the low-potential power supply voltage VSS to the first and second circuit blocks 11 and 12, and shuts off the supply of the low-potential power supply voltage VSS to the first and second circuit blocks 11 and 12.

In addition, the voltage controller 30 controls the power supply voltage VSS supplied to the second circuit block 12 so as not to exceed the power supply voltage VSS supplied to the first circuit block 11. More specifically, when start of operation of the first and second circuit blocks 11 and 12, the voltage controller 30 supplies the power supply voltage VSS to the first circuit block 11 before the second circuit block 12. Also, when stop of the operation of the first and second circuit blocks 11 and 12, the voltage controller 30 shuts off the supply of the power supply voltage VSS to the second circuit block 12 before the first circuit block 11.

Figure 21:
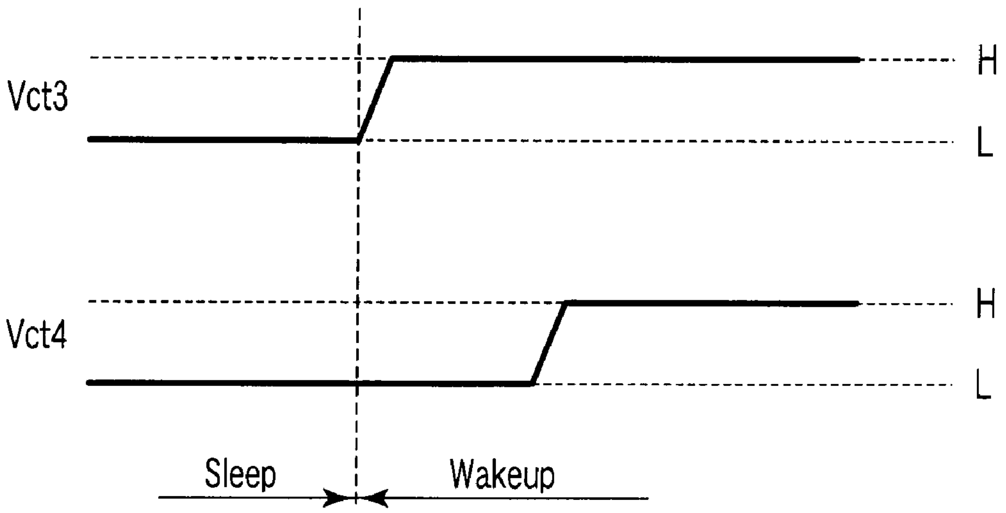
FIG. 21 is a timing chart of control signals Vct3 and Vct4 when a power supply voltage is applied.

FIG. 21 is a timing chart of the control signals Vct3 and Vct4 when the power supply voltage is applied (switched from a sleep state to a wakeup state).

In the sleep state, the signal generator 33 generates Low-level control signals Vct3 and Vct4. The control signals Vct3 and Vct4 are respectively supplied to the gate terminals of the NMOS transistors 31 and 32. In the sleep state, therefore, both the NMOS transistors 31 and 32 are kept off. Consequently, the power supply voltage VSS to the first and second circuit blocks 11 and 12 is shut off.

When start of the operation, the signal generator 33 first changes the control signal Vct3 to high level. This turns on the NMOS transistor 31 to supply the low-potential power supply voltage VSS to the first circuit block 11.

After that, the signal generator 33 changes the control signal Vct4 to high level. This turns on the NMOS transistor 32 to supply the low-potential power supply voltage VSS to the second circuit block 12.

Figure 22:
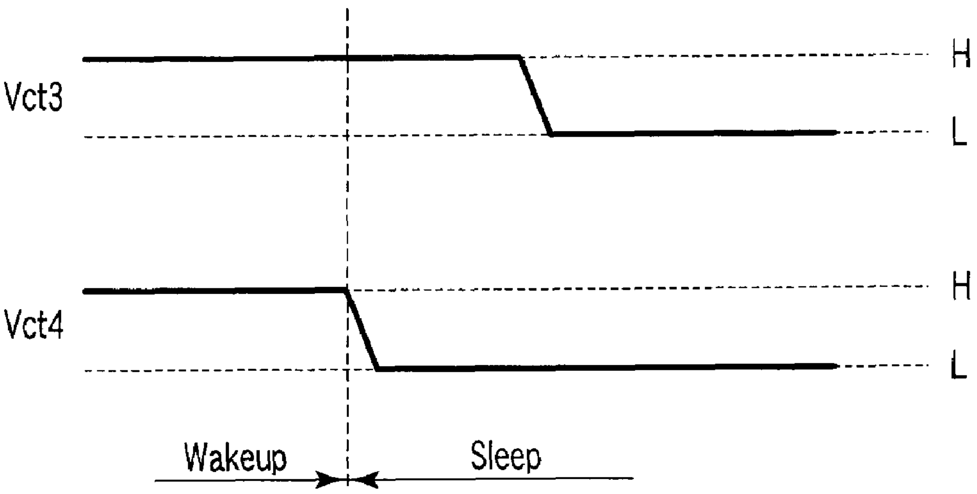
FIG. 22 is a timing chart of the control signals Vct3 and Vct4 when the power supply voltage is shut off.

FIG. 22 is a timing chart of the control signals Vct3 and Vct4 when the power supply voltage is shut off (switched from the wakeup state to the sleep state).

In the wakeup state, the signal generator 33 generates High-level control signals Vct3 and Vct4. In the wakeup state, therefore, the NMOS transistors 31 and 32 are kept on. Consequently, the first and second circuit blocks 11 and 12 receive the low-potential power supply voltage VSS.

When stop of the operation, the signal generator 33 first changes the control signal Vct4 to low level. This turns off the NMOS transistor 32 to shut off the supply of the low-potential power supply voltage VSS to the second circuit block 12.

After that, the signal generator 33 changes the control signal Vct3 to low level. This turns off the NMOS transistor 31 to shut off the supply of the low-potential power supply voltage VSS to the first circuit block 11.

It is possible by power supply voltage control as described above to prevent a crowbar current in the semiconductor integrated circuit.

Figure 23:
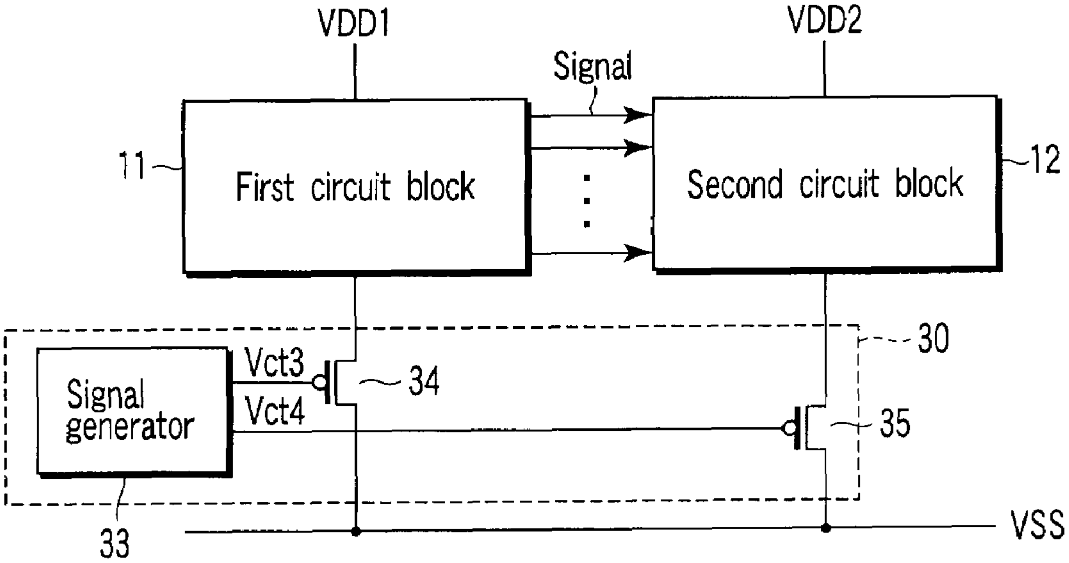
FIG. 23 is a block diagram illustrating another example of the arrangement of the semiconductor integrated circuit according to the sixth embodiment of the present invention.

Note that the switching elements for connecting/disconnecting the current path between the low-potential power supply voltage VSS and first circuit block 11 and the current path between the low-potential power supply voltage VSS and second circuit block 12 may also be formed by PMOS transistors. FIG. 23 is a block diagram illustrating another example of the arrangement of the semiconductor integrated circuit according to this embodiment.

A voltage controller 30 comprises PMOS transistors 34 and 35 and a signal generator 33. The PMOS transistor 34 receives a low-potential power supply voltage VSS at its drain terminal. The source terminal of the PMOS transistor 34 is connected to a first circuit block 11. A control signal Vct3 is input to the gate terminal of the PMOS transistor 34. The PMOS transistor 35 receives the low-potential power supply voltage VSS at its drain terminal. The source terminal of the PMOS transistor 35 is connected to a second circuit block 12. A control signal Vct4 is input to the gate terminal of the PMOS transistor 35.

The signal generator 33 changes the control signals Vct3 and Vct4 at the same timings as shown in FIGS. 21 and 22. Note that in the configuration shown in FIG. 23, the control signals Vct3 and Vct4 are supplied to the PMOS transistors, so the logic of these control signals is opposite to that shown in FIGS. 21 and 22.

Even when the voltage controller 30 is formed as shown in FIG. 23, a crowbar current can be prevented in the semiconductor integrated circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit, comprising:

a first circuit block which operates at a first internal voltage;

a second circuit block which operates at a second internal voltage, is connected to an output stage of the first circuit block, and receives a signal from the first circuit block, the second internal voltage being different from the first internal voltage; and a first voltage controller which supplies the first internal voltage to the first circuit block by using a first higher-potential power; and a second voltage controller which supplies the second internal voltage to the second circuit block by using a second higher-potential power, and performs control such that the second internal voltage does not exceed the first internal voltage, wherein, the first voltage controller changes a level of the first internal voltage on the basis of a first target voltage, and the second voltage controller changes a level of the second internal voltage on the basis of a second target voltage.

2. The circuit according to claim 1, wherein the first internal voltage and the second internal voltage change levels thereof.

3. The circuit according to claim 1, wherein the voltage controller controls supply/shutoff of the first higher-potential power and the second higher-potential power with respect to the first circuit block and the second circuit block, respectively, supplies the first higher-potential power before the second higher-potential power when start of operation of the circuit blocks, and shuts off the first higher-potential power after the second higher-potential power when stop of the operation.

4. The circuit according to claim 3, wherein the second higher-potential power is not higher than the first higher-potential power.

5. The circuit according to claim 3, wherein the voltage controller comprises:

a first switching element formed in a current path between the first higher-potential power and the first circuit block;

a second switching element formed in a current path between the second higher-potential power and the second circuit block; and a signal generator which controls on/off operation of the first switching element with a first control signal and the second switching element with a second control signal.

6. The circuit according to claim 5, wherein each of the first switching element and the second switching element is a metal oxide semiconductor (MOS) transistor.

7. The circuit according to claim 1, wherein each of the first circuit block and the second circuit block comprises an inverter having a complementary metal oxide semiconductor (CMOS) structure.

8. A semiconductor integrated circuit, comprising:

a first circuit block which operates at a first internal voltage;

a second circuit block which operates at a second internal voltage, is connected to an output stage of the first circuit block, and receives a signal from the first circuit block, the second internal voltage being different from the first internal voltage;

a first voltage controller which supplies the first internal voltage to the first circuit block by using a first higher-potential power; and a second voltage controller which supplies the second internal voltage to the second circuit block by using a second higher-potential power, and performs control such that the second internal voltage does not exceed the first internal voltage, wherein, the first voltage controller includes a first P-type transistor including a drain terminal connected to the first circuit block, and a source terminal connected to the first higher-potential power, and a first comparator which supplies a voltage based on a difference between the first internal voltage and a first target voltage to a gate terminal of the first P-type transistor, and the second voltage controller includes a second P-type transistor including a drain terminal connected to the second circuit block, and a source terminal connected to the second higher-potential power, an OR circuit including an output connected to a gate terminal of the second P-type transistor, a second comparator which supplies a voltage based on a difference between the second internal voltage and a second target voltage to one input of the OR circuit, and a third comparator which supplies a voltage based on a difference between the first internal voltage and the second internal voltage to the other input of the OR circuit.

9. A semiconductor integrated circuit comprising:

a first circuit block which operates at a first internal voltage;

a second circuit block which operates at a second internal voltage, is connected to an output stage of the first circuit block, and receives a signal from the first circuit block, the second internal voltage being different from the first internal voltage; and a voltage controller which supplies the first internal voltage to the first circuit block by using a first lower-potential power, supplies the second internal voltage to the second circuit block by using a second lower-potential power, and performs control such that the first internal voltage does not exceed the second internal voltage.

10. The circuit according to claim 9, wherein the voltage controller comprises:

a first voltage controller which supplies the first internal voltage to the first circuit block, and performs control such that the first internal voltage does not exceed the second internal voltage; and a second voltage controller which supplies the second internal voltage to the second circuit block.

11. The circuit according to claim 10, wherein the first internal voltage and the second internal voltage change levels thereof.

12. The circuit according to claim 11, wherein the first voltage controller changes the level of the first internal voltage on the basis of a first target voltage, and the second voltage controller changes the level of the second internal voltage on the basis of a second target voltage.

13. The circuit according to claim 9, wherein the first voltage controller comprises:

a first N-type transistor including a drain terminal connected to the first circuit block, and a source terminal connected to the first lower-potential power;

an OR circuit including an output connected to a gate terminal of the first N-type transistor;

a first comparator which supplies a voltage based on a difference between the first internal voltage and a first target voltage to one input of the OR circuit; and a second comparator which supplies a voltage based on a difference between the first internal voltage and the second internal voltage to the other input of the OR circuit, and the second voltage controller comprises:

a second N-type transistor including a drain terminal connected to the second circuit block, and a source terminal which receives the second lower-potential power; and a third comparator which supplies a voltage based on a difference between the second internal voltage and a second target voltage to a gate terminal of the second N-type transistor.

14. The circuit according to claim 9, wherein each of the first circuit block and the second circuit block comprises an inverter having a CMOS structure.

* * * * *